(12) United States Patent
Lee et al.

(10) Patent No.: US 11,726,244 B2
(45) Date of Patent: Aug. 15, 2023

(54) POLARIZING PLATE FOR LIGHT EMITTING DISPLAYS AND LIGHT EMITTING DISPLAY COMPRISING THE SAME

(71) Applicant: SAMSUNG SDI CO., LTD., Yongin-si (KR)

(72) Inventors: Do Heon Lee, Suwon-si (KR); Seung Hoon Lee, Suwon-si (KR); Il Jin Kim, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 323 days.

(21) Appl. No.: 16/674,393

(22) Filed: Nov. 5, 2019

(65) Prior Publication Data
US 2020/0142116 A1    May 7, 2020

(30) Foreign Application Priority Data
Nov. 6, 2018    (KR) .................... 10-2018-0135141

(51) Int. Cl.
*G02B 5/30* (2006.01)
*C09J 163/10* (2006.01)
(Continued)

(52) U.S. Cl.
CPC .......... *G02B 5/3016* (2013.01); *C09J 163/10* (2013.01); *G02B 5/30* (2013.01); *C09J 2301/416* (2020.08); *H01L 33/44* (2013.01); *H10K 50/868* (2023.02)

(58) Field of Classification Search
CPC ........ G02B 5/30; G02B 5/3016; C09J 163/10; C09J 2301/416
See application file for complete search history.

(56) References Cited

U.S. PATENT DOCUMENTS 5,157,589 A * 10/1992 Cole, Jr. ................. H01L 23/13
257/700
2005/0133760 A1* 6/2005 Farrand ................ C09K 19/586
252/299.01
(Continued)

FOREIGN PATENT DOCUMENTS

JP    2014-032270 A    2/2014
KR    10-2013-0020618 A    2/2013
(Continued)

OTHER PUBLICATIONS

Korean Office Action in corresponding Korean Patent Application No. 10-2018-0135141, Korean Office Action dated Mar. 22, 2021 (6 pgs.).

(Continued)

*Primary Examiner* — Sophie Hon
(74) *Attorney, Agent, or Firm* — Lewis Roca Rothgerber Christie LLP

(57) ABSTRACT

A polarizing plate for light emitting displays and a light emitting display including the same are provided. A polarizing plate includes: a polarizer; and a first liquid crystal retardation film, a first bonding layer, and a second liquid crystal retardation film sequentially stacked on a surface of the polarizer, and the first bonding layer has a glass transition temperature of about 70° C. to about 100° C. and is formed of a composition including at least one selected from among an alicyclic group-containing glycidyl ether and an aromatic group-containing glycidyl ether.

15 Claims, 1 Drawing Sheet

(51) Int. Cl.
*H01L 33/44* (2010.01)
*H10K 50/80* (2023.01)

(56) References Cited

U.S. PATENT DOCUMENTS

| | | | | |
|---|---|---|---|---|
| 2006/0159936 | A1* | 7/2006 | Chang | H01J 11/44 |
| | | | | 428/447 |
| 2014/0120295 | A1* | 5/2014 | Mochizuki | G11B 7/256 |
| | | | | 428/41.8 |
| 2015/0315431 | A1* | 11/2015 | Yu | C08L 63/00 |
| | | | | 522/26 |
| 2016/0238771 | A1* | 8/2016 | Lee | G02F 1/133528 |
| 2016/0370508 | A1* | 12/2016 | Jeong | C09J 7/35 |
| 2019/0107657 | A1* | 4/2019 | Jung | B32B 27/306 |

FOREIGN PATENT DOCUMENTS

| | | | | |
|---|---|---|---|---|
| KR | 10-2016-0007350 A | | 1/2016 | |
| KR | 10-2017-0108792 A | | 9/2017 | |
| KR | 102403282 B1 | * | 5/2022 | ............ G02B 5/30 |
| TW | I525168 B | | 3/2016 | |
| TW | 201739812 A | | 11/2017 | |
| TW | I730485 B | * | 6/2021 | ............ G02B 5/30 |
| WO | WO-2017159969 A1 | * | 9/2017 | ........... B32B 27/306 |

OTHER PUBLICATIONS

Taiwan Office Action in corresponding Taiwanese Patent Application No. 108139601, with English summary, Taiwan Office Action dated Oct. 22, 2020 (9 pgs.).

* cited by examiner

POLARIZING PLATE FOR LIGHT EMITTING DISPLAYS AND LIGHT EMITTING DISPLAY COMPRISING THE SAME

CROSS-REFERENCE TO RELATED APPLICATION

This application claims priority to and the benefit of Korean Patent Application No. 10-2018-0135141, filed on Nov. 6, 2018 in the Korean Intellectual Property Office, the entire disclosure of which is incorporated herein by reference.

BACKGROUND

1. Field

Aspects of embodiments of the present invention relate to a polarizing plate for light emitting displays and a light emitting display including the same.

2. Description of the Related Art

An organic light emitting display is a self-emissive type display apparatus and does not require a separate polarizing plate, unlike a liquid crystal display. However, the organic light emitting display includes a retardation film having a predetermined range of phase retardation between a polarizer and an organic light emitting device panel to improve screen quality by preventing reflection of external light through conversion of linear polarized light received from the polarizer into circular polarized light.

To this end, a thin liquid crystal retardation film has recently been used as the retardation film, thereby achieving improvement in screen quality and reduction in thickness of a polarizing plate. As the retardation film, a stack of $\lambda/2$ retardation liquid crystal films and $\lambda/4$ retardation liquid crystal films has been used in the art, without being limited thereto. Accordingly, there is a need for a bonding layer exhibiting high peel strength with respect to both the $\lambda/2$ retardation liquid crystal film and the $\lambda/4$ retardation liquid crystal film. In addition, with recent development of a foldable display, there is a need for a polarizing plate applicable to both the organic light emitting display and the foldable display.

The background technique of the present invention is disclosed in Japanese Unexamined Patent Publication No. 2014-032270.

SUMMARY

According to an aspect of embodiments of the present invention, a polarizing plate exhibits good peel strength with respect to a liquid crystal retardation film and secures good reliability and flexibility.

According to another aspect of embodiments of the present invention, a polarizing plate is capable of minimizing or reducing influence on polarized light passing through a first liquid crystal retardation film and a second liquid crystal retardation film.

According to one or more embodiments of the present invention, a polarizing plate for light emitting displays includes: a polarizer; and a first liquid crystal retardation film, a first bonding layer, and a second liquid crystal retardation film sequentially stacked on a surface of the polarizer, wherein the first bonding layer has a glass transition temperature of about 70° C. to about 100° C. and is formed of a composition including at least one selected from among an alicyclic group-containing glycidyl ether and an aromatic group-containing glycidyl ether.

The first bonding layer may be directly formed on each of the first liquid crystal retardation film and the second liquid crystal retardation film.

The polarizing plate for light emitting displays may have a polarization degree variation $\Delta PE_1$ or $\Delta PE_2$ of about 1% or less according to Equation 1 or 2:

$$\Delta PE_1 = |P1-P2|, \qquad \text{Equation 1}$$

where P1 indicates an initial degree of polarization (unit: %) as measured on a specimen obtained by cutting the polarizing plate to a size of 3 cm×3 cm (length×width, MD of polarizer×TD of the polarizer), and P2 indicates a degree of polarization (unit: %) as measured on the specimen after leaving the specimen at a constant temperature of 85° C. for 500 hours; and $$\Delta PE_2 = |P1-P3|, \qquad \text{Equation 2}$$

where P3 indicates a degree of polarization (unit: %) as measured on the specimen after leaving the specimen under constant temperature and humidity conditions of 60° C. and 95% for 500 hours.

The alicyclic group-containing glycidyl ether may include at least one selected from among 1,4-cyclohexane dimethanol diglycidyl ether, bis(4-hydroxycyclohexyl)methane diglycidyl ether, and 2,2-bis(4-hydroxycyclohexyl)-propane diglycidyl ether.

The aromatic group-containing glycidyl ether may include at least one selected from among resorcinol diglycidyl ether and 4,4'-(1-methylethylidende)bisphenol with (chloromethyl)oxirane.

The composition may further include an aliphatic acyclic glycidyl ether.

The composition for the first bonding layer may be free from an alicyclic epoxy compound.

At least one selected from among the alicyclic group-containing glycidyl ether and the aromatic group-containing glycidyl ether may be present in about 20 wt % to about 90 wt % in the composition in terms of solid content.

The composition may further include a (meth)acrylate compound. The (meth)acrylate compound may include a (meth)acrylate containing at least one hydroxyl group.

The (meth)acrylate containing at least one hydroxyl group may be present in an amount of about 5 parts by weight to about 80 parts by weight relative to a total of 100 parts by weight of the epoxy compound and the (meth)acrylate compound.

The (meth)acrylate compound may further include a (meth)acrylate containing an aromatic group.

The composition may further include a photo-cationic initiator and a photo-enhancer.

The composition may include about 20 parts by weight to about 95 parts by weight of at least one selected from among the alicyclic group-containing glycidyl ether and the aromatic group-containing glycidyl ether; about 5 parts by weight to about 80 parts by weight of a (meth)acrylate compound; and about 0.5 parts by weight to about 10 parts by weight of a photo-cationic initiator and about 0.1 parts by weight to about 10 parts by weight of a photo-enhancer, relative to a total of 100 parts by weight of the (meth)acrylate compound and the at least one selected from among the alicyclic group-containing glycidyl ether and the aromatic group-containing glycidyl ether.

The composition may include about 20 parts by weight to about 94 parts by weight of at least one selected from among the alicyclic group-containing glycidyl ether and the aromatic group-containing glycidyl ether; about 1 part by weight to about 40 parts by weight of an aliphatic acyclic glycidyl ether; about 5 parts by weight to about 75 parts by weight of a (meth)acrylate compound; and about 0.5 parts by weight to about 10 parts by weight of a photo-cationic initiator and about 0.1 parts by weight to about 10 parts by weight of a photo-enhancer, relative to a total of 100 parts by weight of the at least one selected from among the alicyclic group-containing glycidyl ether and the aromatic group-containing glycidyl ether, the aliphatic acyclic glycidyl ether, and the (meth)acrylate compound.

Each of the first liquid crystal retardation film and the second liquid crystal retardation film may be formed of a (meth)acrylic compound containing an alicyclic group or a (meth)acrylic liquid crystal compound containing an aromatic group.

The polarizing plate may further include a second bonding layer between the polarizer and the first liquid crystal retardation film, wherein the second bonding layer has a different glass transition temperature than the first bonding layer.

The second bonding layer may be formed of a water-based bonding agent or a photocurable bonding agent.

The polarizing plate may further include a protective layer on another surface of the polarizer.

The protective layer may include at least one of a protective film or a protective coating layer.

In accordance with one or more embodiments of the present invention, a light emitting display may include the polarizing plate for light emitting displays according to an embodiment of the present invention.

The light emitting display may include a foldable light emitting display.

According to an aspect of embodiments of the present invention, a polarizing plate exhibiting good peel strength with respect to a liquid crystal retardation film and securing good reliability and flexibility is provided.

According to another aspect of embodiments of the present invention, a polarizing plate capable of minimizing or reducing influence on polarized light passing through a first liquid crystal retardation film and a second liquid crystal retardation film is provided.

DETAILED DESCRIPTION

Figure 1:
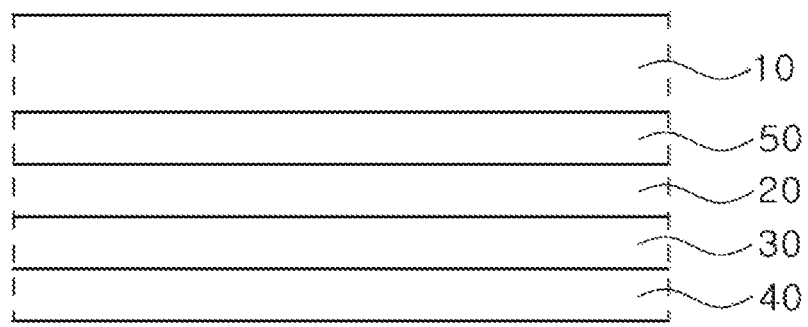
FIG. 1 is a cross-sectional view of a polarizing plate for light emitting displays according to an embodiment of the present invention.

Embodiments of the present invention will be described in further detail with reference to the accompanying drawings to provide a thorough understanding of the invention to those skilled in the art. It is to be understood that the present invention may be embodied in different ways and is not limited to the following embodiments. In the drawings, portions not relevant to the description may be omitted for clarity. Like components will be denoted by like reference numerals throughout the specification. It is to be understood that lengths, thicknesses, and the like of each component may be exaggerated or not illustrated to scale in the accompanying drawings for ease of description of the present invention, and the present invention is not limited thereto.

Herein, spatially relative terms, such as "upper" and "lower," are defined with reference to the accompanying drawings. Thus, it is to be understood that the term "upper surface" can be used interchangeably with the term "lower surface," for example.

Herein, "X to Y" indicate "X or more to Y or less" or "X and Y".

Herein, "in-plane retardation (Re)" is a value measured at a wavelength of 550 nm and is represented by Equation A:

$$Re=(nx-ny)\times d, \qquad \text{Equation A}$$

where nx and ny are the indices of refraction in the slow and fast axes of a liquid crystal retardation film at a wavelength of 550 nm, respectively, and d is the thickness (unit: nm) of the liquid crystal retardation film.

Herein, the term "light emitting device" includes an organic or inorganic light emitting device and may mean a light emitting diode (LED), an organic light emitting diode (OLED), a quantum dot light emitting diode (QLED), a device containing a light emitting substance, such as phosphors, and the like.

Unless otherwise defined, all terms used herein (including technical or scientific terms) have the same meanings as those generally understood by those skilled in the art to which the inventive concept pertains. Such terms as those defined in a generally used dictionary are to be interpreted as having meanings equal to the contextual meanings in the relevant field of art, and are not to be interpreted as having idealized or excessively formal meanings unless clearly defined herein.

Based on findings that, in a polarizing plate for light emitting displays including a polarizer, a first liquid crystal retardation film, a first bonding layer, and a second liquid crystal retardation film sequentially stacked in the stated order, the first bonding layer bonding the first liquid crystal retardation film to the second liquid crystal retardation film is formed to have a glass transition temperature of about 70° C. to about 100° C. using a composition including at least one selected from among an alicyclic group-containing glycidyl ether and an aromatic group-containing glycidyl ether to improve peel strength of the first bonding layer with respect to each of the first liquid crystal retardation film and the second liquid crystal retardation film, reliability of the polarizing plate under high temperature and/or high temperature/humidity conditions, and flexibility of the polarizing plate while minimizing or reducing influence on light reflection by the liquid crystal retardation film, the inventors completed the present invention.

The present invention can secure advantageous effects through regulation of the glass transition temperature and the composition of the first bonding layer, which bonds the first liquid crystal retardation film to the second liquid crystal retardation film among a number of bonding layers or adhesive layers in the polarizing plate for light emitting displays.

Herein, a polarizing plate for light emitting displays (herein, "polarizing plate") according to the present invention will be described with reference to FIG. 1.

Referring to FIG. 1, a polarizing plate may include a polarizer 10; and a second bonding layer 50, a first liquid crystal retardation film 20, a first bonding layer 30, and a second liquid crystal retardation film 40, which are sequentially stacked on a surface of the polarizer 10.

First Bonding Layer

In an embodiment, the first bonding layer 30 is directly formed on each of the first liquid crystal retardation film 20 and the second liquid crystal retardation film 40. Herein, the expression "directly formed on" means that another bonding layer, another adhesive layer, or another adhesive/bonding layer is not interposed between the first bonding layer and the first liquid crystal retardation film and between the first bonding layer and the second liquid crystal retardation film excluding the first bonding layer according to the present invention.

The first bonding layer 30 has high initial peel strength and high peel strength as measured after 72 hours at 25° C. with respect to each of the first liquid crystal retardation film and the second liquid crystal retardation film, thereby improving reliability of the polarizing plate under high temperature and/or high temperature/humidity conditions. Herein, "initial peel strength" means peel strength measured immediately after manufacture of the polarizing plate and "peel strength as measured after 72 hours at 25° C." means peel strength of the polarizing plate measured after the polarizing plate is left at 25° C. for 72 hours. In an embodiment, to each of the first liquid crystal retardation film and the second liquid crystal retardation film, the first bonding layer may have an initial peel strength of about 100 gf/25 mm or more, and, in an embodiment, about 100 gf/25 mm to about 2000 gf/25 mm, for example, 100 gf/25 mm, 200 gf/25 mm, 300 gf/25 mm, 400 gf/25 mm, 500 gf/25 mm, 600 gf/25 mm, 700 gf/25 mm, 800 gf/25 mm, 900 gf/25 mm, 1,000 gf/25 mm, 1,100 gf/25 mm, 1,200 gf/25 mm, 1,300 gf/25 mm, 1,400 gf/25 mm, 1,500 gf/25 mm, 1,600 gf/25 mm, 1,700 gf/25 mm, 1,800 gf/25 mm, 1,900 gf/25 mm, or 2,000 gf/25 mm. In an embodiment, to each of the first liquid crystal retardation film and the second liquid crystal retardation film, the first bonding layer has a peel strength of about 200 gf/25 mm or more, as measured after 72 hours at 25° C., and, in an embodiment, about 200 gf/25 mm to about 2,000 gf/25 mm, for example, 200 gf/25 mm, 300 gf/25 mm, 400 gf/25 mm, 500 gf/25 mm, 600 gf/25 mm, 700 gf/25 mm, 800 gf/25 mm, 900 gf/25 mm, 1,000 gf/25 mm, 1,100 gf/25 mm, 1,200 gf/25 mm, 1,300 gf/25 mm, 1,400 gf/25 mm, 1,500 gf/25 mm, 1,600 gf/25 mm, 1,700 gf/25 mm, 1,800 gf/25 mm, 1,900 gf/25 mm, or 2,000 gf/25 mm. Within this range, it is possible to improve processability in manufacture of the polarizing plate and to improve reliability in use of the polarizing plate.

In evaluation of peel strength with respect to the first liquid crystal retardation film, the first bonding layer 30 may have a significantly increased peel strength as measured after 72 hours at 25° C., as compared to the initial peel strength thereof. In evaluation of peel strength with respect to the second liquid crystal retardation film, the first bonding layer 30 may have a significantly increased peel strength as measured after 72 hours at 25° C., as compared to the initial peel strength thereof. As a result, the polarizing plate can achieve improvement in peel strength.

In evaluation of flexibility of the polarizing plate described in further detail below, the first bonding layer 30 can prevent or substantially prevent generation of cracks or creases on each of the first liquid crystal retardation film and the second liquid crystal retardation film, thereby improving flexibility of the polarizing plate. As a result, the polarizing plate can improve screen quality when used in a foldable light emitting display.

For "evaluation of flexibility," 80 μm thick polyethylene terephthalate (PET) films were attached to both surfaces of a polarizing plate (a polarizing plate including a polarizer protective layer, a polarizer, a first retardation film, a first bonding layer, and a second retardation film sequentially stacked in the stated order) via an acrylic adhesive, respectively, followed by cutting the polarizing plate to a size of 6 cm×4 cm (length×width, MD of polarizer×TD of the polarizer), thereby preparing a specimen. In accordance with IEC-62715, the specimen was mounted on a flexibility tester such that the PET film nearest to the polarizer could be placed at an inner side of the polarizing plate upon flexibility testing, followed by repeating 100,000 cycles of bending the specimen at 25° C. under conditions of a bend radius of 5 mm, a bending speed of 30 cycles of bending per minute, and a bend angle of 180° while observing whether cracks or creases were generated in the first liquid crystal retardation film and the second liquid crystal retardation film.

In addition, the first bonding layer 30 may be formed between the first liquid crystal retardation film and the second liquid crystal retardation film to minimize or reduce influence on polarized light during circular polarization of the light while the light having passed through the polarizer sequentially passes through the first liquid crystal retardation film and the second liquid crystal retardation film. As a result, the first bonding layer 30 can improve circular polarization by the first liquid crystal retardation film and the second liquid crystal retardation film.

Further, the first bonding layer 30 can improve reliability of the polarizing plate under high temperature and/or high temperature/humidity conditions. The first liquid crystal retardation film bonded to one surface of the polarizer has a thin thickness and cannot sufficiently suppress variation in polarization degree when the polarizing plate is left under high temperature and/or high temperature/humidity conditions. In an embodiment, the first bonding layer 30 is formed on a surface of the first liquid crystal retardation film, that is, on a surface of the first liquid crystal retardation film to which the polarizer is not bonded, thereby improving reliability through suppression in variation of the polarization degree. For example, the polarizing plate according to the present invention may have a polarization degree variation $\Delta PE_1$ or $\Delta PE_2$ of about 1% or less according to Equation 1 or 2:

$$\Delta PE_1 = |P1-P2|, \qquad \text{Equation 1}$$

where P1 indicates an initial degree of polarization (unit: %) as measured on a specimen obtained by cutting the polarizing plate to a size of 3 cm×3 cm (length×width, MD of polarizer×TD of the polarizer), and P2 indicates a degree of polarization (unit: %) as measured on the specimen after leaving the specimen at a constant temperature of 85° C. for 500 hours; and $$\Delta PE_2 = |P1-P3|, \qquad \text{Equation 2}$$

where P1 indicates an initial degree of polarization (unit: %) as measured on a specimen obtained by cutting the polarizing plate to a size of 3 cm×3 cm (length×width, MD of polarizer×TD of the polarizer), and P3 indicates a degree of polarization (unit: %) as measured on the specimen after leaving the specimen under constant temperature/humidity conditions of 60° C. and 95% for 500 hours.

The effects of the first bonding layer that minimizes or reduces influence on initial peel strength, peel strength at 25° C., reliability, flexibility, and polarized light sequentially passing through the first liquid crystal retardation film and the second liquid crystal retardation film may be realized by forming the first bonding layer to have a glass transition temperature of about 70° C. to about 100° C. using a composition including at least one selected from among an alicyclic group-containing glycidyl ether and an aromatic group-containing glycidyl ether.

For example, although a first bonding layer has a glass transition temperature of about 70° C. to about 100° C., the first bonding layer, which is formed of a composition not including at least one of the alicyclic group-containing glycidyl ether and the aromatic group-containing glycidyl ether, can exhibit low bonding strength with respect to a liquid crystal retardation film and can provide high variation in polarization degree of the polarizing plate left under high temperature/humidity conditions, thereby deteriorating reliability. Further, even when a first bonding layer is formed of the composition including at least one selected from among the alicyclic group-containing glycidyl ether and the aromatic group-containing glycidyl ether, the first bonding layer having a glass transition temperature not in the range of about 70° C. to about 100° C. can suffer from deterioration in flexibility or increase in variation of polarization degree of the polarizing plate left under high temperature/humidity conditions, thereby deteriorating reliability of the polarizing plate.

In an embodiment, the first bonding layer has a glass transition temperature of about 70° C. to about 90° C., and, in an embodiment, about 75° C. to about 90° C., for example, 75° C., 76° C., 77° C., 78° C., 79° C., 80° C., 81° C., 82° C., 83° C., 84° C., 85° C., 86° C., 87° C., 88° C., 89° C., or 90° C.

At least one selected from among the alicyclic group-containing glycidyl ether and the aromatic group-containing glycidyl ether forms the first bonding layer through cationic polymerization initiated by photo energy and may improve peel strength of the first bonding layer to the first liquid crystal retardation film or the second liquid crystal retardation film. In particular, as described below, each of the first liquid crystal retardation film and the second liquid crystal retardation film may be formed of a (meth)acrylic compound containing an alicyclic group or a (meth)acrylic compound containing an aromatic group. Accordingly, the polarizing plate may have improved light transmittance and may improve screen quality by improving adhesion of the first bonding layer to each of the first liquid crystal retardation film and the second liquid crystal retardation film while regulating the index of refraction between the layers to prevent refraction of light at an interface between the first bonding layer and the first liquid crystal retardation film and at an interface between the first bonding layer and the second liquid crystal retardation film. In addition, the glycidyl ether contained in the alicyclic group-containing glycidyl ether or the aromatic group-containing glycidyl ether can secure good chemical bonding by a hydroxyl group generated upon reaction with a photo-enhancer or the (meth)acrylic compound and good wettability to a liquid crystal retardation film, thereby improving peel strength between the first bonding layer and the first liquid crystal retardation film and between the first bonding layer and the second liquid crystal retardation film, while improving flexibility of the polarizing plate.

In an embodiment, at least one selected from among the alicyclic group-containing glycidyl ether and the aromatic group-containing glycidyl ether may be present in an amount of about 20 wt % to about 90 wt %, and, in an embodiment, about 30 wt % to about 80 wt %, and, in an embodiment, about 35 wt % to about 80 wt %, for example, 35 wt %, 40 wt %, 45 wt %, 50 wt %, 55 wt %, 60 wt %, 65 wt %, 70 wt %, 75 wt %, 80 wt %, or 85 wt %, in the composition for bonding layers in terms of solid content. Within this range, the composition for the first bonding layer can prevent or substantially prevent deterioration in peel strength to the liquid crystal retardation film, does not suffer from deterioration in initial peel strength due to retardation of initial reaction rate, and can secure a desired glass transition temperature of the first bonding layer.

In an embodiment, the alicyclic group-containing glycidyl ether is a bifunctional diglycidyl ether and may include a compound containing an alicyclic group and two glycidyl ether groups. The "glycidyl ether group" may include a moiety of Formula 1, without being limited thereto:

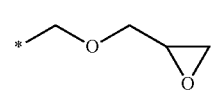

Formula 1 where * is a linking site.

For example, the alicyclic group-containing glycidyl ether may include at least one selected from among 1,4-cyclohexane dimethanol diglycidyl ether, bis(4-hydroxycyclohexyl)methane diglycidyl ether, and 2,2-bis(4-hydroxycyclohexyl)-propane diglycidyl ether.

In an embodiment, 1,4-cyclohexane dimethanol diglycidyl ether is used as the alicyclic group-containing glycidyl ether to secure the effects of the present invention.

In an embodiment, the aromatic group-containing glycidyl ether is a bifunctional diglycidyl ether and may include an aromatic group and two glycidyl ether groups. For example, the aromatic group-containing glycidyl ether may include at least one selected from among resorcinol diglycidyl ether and 4,4'-(1-methylethylidende)bisphenol with (chloromethyl)oxirane.

In an embodiment, resorcinol diglycidyl ether is used as the aromatic group-containing glycidyl ether to secure the effects of the present invention.

Next, the composition for the first bonding layer will be described in more detail.

In an embodiment, the composition for the first bonding layer includes an epoxy compound, a (meth)acrylate compound, a photo-cationic initiator, and a photo-enhancer, wherein the epoxy compound may include at least one selected from among the alicyclic group-containing glycidyl ether and the aromatic group-containing glycidyl ether.

In an embodiment, at least one selected from among the alicyclic group-containing glycidyl ether and the aromatic group-containing glycidyl ether may be present in an amount of about 20 parts by weight to about 95 parts by weight, and, in an embodiment, about 20 parts by weight to about 94 parts by weight, and, in an embodiment, about 30 parts by weight to about 90 parts by weight, for example, 70 parts by weight to 90 parts by weight, 80 parts by weight to 90 parts by weight, or 30 parts by weight to 60 parts by weight, relative to a total of 100 parts by weight of the epoxy compound and the (meth)acrylate compound. Within this range, the composition for the first bonding layer may prevent or substantially prevent deterioration in peel strength to the liquid crystal retardation film and does not suffer from deterioration in initial peel strength due to retardation of initial reaction rate.

In an embodiment, the epoxy compound may consist of the alicyclic group-containing glycidyl ether.

In another embodiment, the epoxy compound may consist of the aromatic group-containing glycidyl ether.

In a further embodiment, the epoxy compound may consist of a mixture of the alicyclic group-containing glycidyl ether and the aromatic group-containing glycidyl ether.

In another embodiment, the epoxy compound may further include an aliphatic acyclic glycidyl ether in addition to the alicyclic group-containing glycidyl ether and the aromatic group-containing glycidyl ether. The aliphatic acyclic glycidyl ether may improve applicability (coatability) of the composition for the first bonding layer by preventing or substantially preventing increase in viscosity of the composition.

In an embodiment, the aliphatic acyclic glycidyl ether is a bifunctional glycidyl ether and, in an embodiment, contains two glycidyl ether groups in an aliphatic chain. For example, the aliphatic acyclic glycidyl ether may include at least one selected from among 1,4-butanediol diglycidyl ether, 1,6-hexanediol diglycidyl ether, neopentyl glycol diglycidyl ether, and ethylene glycol diglycidyl ether.

The aliphatic acyclic glycidyl ether may be optionally present in an amount of about 50 parts by weight or less, for example, 1 part by weight to 40 parts by weight, 10 parts by weight to 30 parts by weight, or 20 parts by weight to 50 parts by weight, relative to a total of 100 parts by weight of the epoxy compound and the (meth)acrylate compound. Within this range, the composition can achieve good coatability through reduction in viscosity of the composition.

In another embodiment, the composition for the first bonding layer may be free from the alicyclic epoxy compound. Herein, the "alicyclic epoxy compound" may refer to a compound containing an epoxidized alicyclic group. In an embodiment, for example, the alicyclic epoxy compound is a bifunctional alicyclic epoxy compound and may include at least one selected from among 3,4-epoxycyclohexylmethyl-3',4'-epoxycyclohexanecarboxylate, 3,4-epoxy-6-methylcyclohexylmethyl-3',4'-epoxy-6'-methylcyclohexane carboxylate, bis(3,4-epoxy-6-methylcyclohexyl)adipate, bicyclohexyldiepoxide(3,4,3',4'-diepoxy-bicyclohexane), and 3,4-epoxycyclohexylmethyl-3',4'-epoxycyclohexanecarboxylate modified epsilon-caprolactone, without being limited thereto.

The (meth)acrylate compound is polymerized by a photoenhancer initiated by photo-energy and can stably react by photo-energy without inhibition of reaction by moisture. The (meth)acrylate compound may include a (meth)acrylate containing at least one hydroxyl group.

The (meth)acrylate containing at least one hydroxyl group may improve bondability of the first bonding layer at an interface between the first liquid crystal retardation film and the second liquid crystal retardation film in the course of curing, and may promote chain transfer reaction with an epoxy compound having activated cations, thereby securing good bondability.

In an embodiment, the (meth)acrylate containing at least one hydroxyl group is a monofunctional (meth)acrylate and may include at least one selected from among a (meth)acrylate containing a $C_1$ to $C_{20}$ alkyl group having at least one hydroxyl group, a (meth)acrylate containing a $C_3$ to $C_{20}$ alicyclic group having at least one hydroxyl group, and a (meth)acrylate containing a $C_6$ to $C_{20}$ aromatic group having at least one hydroxyl group. For example, the (meth)acrylate containing at least one hydroxyl group may include at least one selected from among 2-hydroxyethyl (meth)acrylate, 4-hydroxybutyl (meth)acrylate, 2-hydroxypropyl (meth)acrylate, 2-hydroxybutyl (meth)acrylate, 6-hydroxyhexyl (meth)acrylate, 1,4-cyclohexanedimethanol mono(meth)acrylate, 1-chloro-2-hydroxypropyl (meth)acrylate, diethylene glycol mono(meth)acrylate, 1,6-hexanediol mono(meth)acrylate, 2-hydroxy-3-phenoxypropyl (meth)acrylate, 4-hydroxycyclohexyl (meth)acrylate, 2-hydroxy-3-phenoxybutyl (meth)acrylate, and 4-hydroxycyclohexyl (meth)acrylate, without being limited thereto.

In an embodiment, the (meth)acrylate containing at least one hydroxyl group may be present in an amount of about 5 parts by weight to about 80 parts by weight, for example, 5 parts by weight to 20 parts by weight, 5 parts by weight to less than 20 parts by weight, 5 parts by weight to 18 parts by weight, or 10 parts by weight to 20 parts by weight, relative to a total of 100 parts by weight of the epoxy compound and the (meth)acrylate compound. Within this range, the composition may prevent or substantially prevent deterioration in initial peel strength between the bonding layer and the liquid crystal retardation film and durability of the polarizing plate.

In an embodiment, the (meth)acrylate compound may further include a (meth)acrylate containing an aromatic group in addition to the (meth)acrylate containing at least one hydroxyl group. The (meth)acrylate containing an aromatic group is free from at least one hydroxyl group. The (meth)acrylate containing an aromatic group can serve to improve initial reactivity of the composition for bonding layers and peel strength of the bonding layer with respect to the liquid crystal retardation film. The (meth)acrylate containing an aromatic group is a monofunctional or polyfunctional (meth)acrylate, and may include, for example, a (meth)acrylate having a $C_1$ to $C_5$ alkyl group containing a $C_6$ to $C_{20}$ aryloxy group (for example, a phenoxy group). In an embodiment, the (meth)acrylate containing an aromatic group includes phenoxy ethyl (meth)acrylate.

In an embodiment, the (meth)acrylate containing an aromatic group may be present in an amount of about 20 parts by weight or less, for example, less than 20 parts by weight, 1 part by weight to 20 parts by weight, 1 part by weight to 15 parts by weight, or 1 part by weight to 10 parts by weight, relative to a total of 100 parts by weight of the epoxy compound and the (meth)acrylate compound. Within this range, the composition may allow the bonding layer to have a glass transition temperature according to the present invention.

In an embodiment, in a total of 100 parts by weight of at least one selected from among the alicyclic group-containing glycidyl ether and the aromatic group-containing glycidyl ether and the (meth)acrylate compound, the at least one selected from among the alicyclic group-containing glycidyl ether and the aromatic group-containing glycidyl ether may be present in an amount of about 20 parts by weight to about 95 parts by weight, and, in an embodiment, about 80 parts by weight to about 95 parts by weight, and the (meth)acrylate compound may be present in an amount of about 5 parts by weight to about 80 parts by weight, and, in an embodiment, about 5 parts by weight to about 20 parts by weight. Within this range, the composition may improve initial bonding strength of the first bonding layer and enables regulation of the glass transition temperature thereof.

In an embodiment, in a total of 100 parts by weight of at least one selected from among the alicyclic group-containing glycidyl ether and the aromatic group-containing glycidyl ether, the aliphatic acyclic glycidyl ether, and the (meth)acrylate compound, the at least one selected from among the alicyclic group-containing glycidyl ether and the aromatic group-containing glycidyl ether may be present in an amount of about 20 parts by weight to about 94 parts by weight, the aliphatic acyclic glycidyl ether may be present in an amount of about 1 part by weight to about 40 parts by weight, and the (meth)acrylate compound may be present in an amount of about 5 parts by weight to about 75 parts by weight. Within this range, the composition can improve initial bonding strength of the first bonding layer and enables regulation of the glass transition temperature thereof.

In an embodiment, the photo-cationic initiator may include a typical photo-cationic initiator capable of performing photo-curing reaction.

The photo-cationic initiator may include onium salts of onium ions including cations and anions. Examples of the onium ions may include diaryliodonium, such as diphenyliodonium, 4-methoxydiphenyliodonium, bis(4-methylphenyl)iodonium, bis(4-tert-butylphenyl)iodonium, bis(dodecylphenyl)iodonium, and (4-methylphenyl)[(4-(2-methylpropyl)phenyl)iodonium; triarylsulfonium, such as triphenylsulfonium and diphenyl-4-thiophenoxyphenylsulfonium; bis[4-(diphenylsulfonio)phenyl]sulfide, bis [4-(di(4-(2-hydroxyethyl)phenyl)sulfonio)-phenyl]sulfide, (η5-2,4-cyclopentadiene-1-yl)[(1,2,3,4,5,6-η)-(1-methylethyl)benzene]iron(1+), and the like. Examples of the anions may include tetrafluoroborate ($BF_4^-$), hexafluorophosphate ($PF_6^-$), hexafluoroantimonate ($SbF_6^-$), hexafluoroarsenate ($AsF_6^-$), hexachloroantimonate ($SbCl_6^-$), and the like.

In an embodiment, the photo-cationic initiator may be present in an amount of about 0.5 parts by weight to about 10 parts by weight, and, in an embodiment, about 1 part by weight to about 6 parts by weight, for example, 1 part by weight, 2 parts by weight, 3 parts by weight, 4 parts by weight, 5 parts by weight, or 6 parts by weight, relative to a total of 100 parts by weight of the epoxy compound and the (meth)acrylate compound. Within this range, the composition for bonding layers may be sufficiently cured and may not suffer from deterioration in peel strength, bleeding out of the photo-cationic initiator, and the like.

The photo-enhancer is a photo-radical initiator and generates a small amount of radicals upon irradiation with light to accelerate curing reaction. The photo-enhancer may include any of phosphorus, triazine, acetophenone, benzophenone, thioxanthone, benzoin, oxime compounds, and a mixture thereof. In some embodiments, the photo-enhancer may include a thioxanthone photo-enhancer or a mixture thereof.

In an embodiment, the photo-enhancer may be present in an amount of about 0.1 parts by weight to about 10 parts by weight, and, in an embodiment, about 0.5 parts by weight to about 6 parts by weight, for example, about 0.5 parts by weight, 1 part by weight, 2 parts by weight, 3 parts by weight, 4 parts by weight, 5 parts by weight, or 6 parts by weight, relative to a total of 100 parts by weight of the epoxy compound and the (meth)acrylate compound. Within this range, the (meth)acrylate compound may be sufficiently cured under conditions of light intensity for a process and reactivity of the photo-cationic initiator may be improved.

In an embodiment, the composition for the first bonding layer 30 may include: about 80 parts by weight to about 95 parts by weight of at least one selected from among the alicyclic group-containing glycidyl ether and the aromatic group-containing glycidyl ether; about 5 parts by weight to about 20 parts by weight of the (meth)acrylate containing at least one hydroxyl group; and about 0.5 parts by weight to about 10 parts by weight of the photo-cationic initiator and about 0.1 parts by weight to about 10 parts by weight of the photo-enhancer relative to a total of 100 parts by weight of the at least one selected from among the alicyclic group-containing glycidyl ether and the aromatic group-containing glycidyl ether and the (meth)acrylate containing at least one hydroxyl group.

In another embodiment, the composition for the first bonding layer 30 may include: about 30 parts by weight to about 60 parts by weight of at least one selected from among the alicyclic group-containing glycidyl ether and the aromatic group-containing glycidyl ether; about 20 parts by weight to about 50 parts by weight of the aliphatic acyclic glycidyl ether; about 10 parts by weight to about 20 parts by weight of the (meth)acrylate containing at least one hydroxyl group; and about 0.5 parts by weight to about 10 parts by weight of the photo-cationic initiator and about 0.1 parts by weight to about 10 parts by weight of the photo-enhancer relative to a total of 100 parts by weight of the at least one selected from among the alicyclic group-containing glycidyl ether and the aromatic group-containing glycidyl ether, the aliphatic acyclic glycidyl ether, and the (meth)acrylate containing at least one hydroxyl group.

In a further embodiment, the composition for the first bonding layer 30 may include: about 30 parts by weight to about 60 parts by weight of at least one selected from among the alicyclic group-containing glycidyl ether and the aromatic group-containing glycidyl ether, about 20 parts by weight to about 50 parts by weight of the aliphatic acyclic glycidyl ether, about 10 parts by weight to about 20 parts by weight of the (meth)acrylate containing at least one hydroxyl group; about 1 part by weight to about 20 parts by weight of the (meth)acrylate containing an aromatic group; and about 0.5 parts by weight to about 10 parts by weight of the photo-cationic initiator and about 0.1 parts by weight to about 10 parts by weight of the photo-enhancer relative to a total of 100 parts by weight of the at least one selected from among the alicyclic group-containing glycidyl ether and the aromatic group-containing glycidyl ether, the aliphatic acyclic glycidyl ether, the (meth)acrylate containing at least one hydroxyl group, and the (meth)acrylate containing an aromatic group.

The composition for the first bonding layer may be prepared by mixing the epoxy compound, the (meth)acrylate compound, the photo-cationic initiator, and the photo-enhancer. The composition for the first bonding layer may be a solvent-free type or may further include a solvent to improve applicability (coatability).

The composition for the first bonding layer may further include an antioxidant, a UV absorbent, an additive for imparting conductivity, such as an ion conductor and conductive metal oxide particles, an additive for imparting light diffusivity, a viscosity regulator, and the like, within the ranges not deteriorating the effects of the present invention.

In an embodiment, the first bonding layer 30 may have a thickness of about 0.1 µm to about 30 µm, and, in an embodiment, about 1 µm to about 10 µm, for example, about 1 µm, 2 µm, 3 µm, 4 µm, 5 µm, 6 µm, 7 µm, 8 µm, 9 µm, or 10 µm. Within this range, the first bonding layer 30 may have a suitable thickness to secure peel strength with respect to each of the first liquid crystal retardation film and the second liquid crystal retardation film, and may be used in a polarizing plate.

First Liquid Crystal Retardation Film and Second Liquid Crystal Retardation Film The first liquid crystal retardation film 20 and the second liquid crystal retardation film 40 can improve screen quality by preventing or substantially preventing reflection of external light through circular polarization of linear polarized light having passed through the polarizer.

In an embodiment, for circular polarization of the linear polarized light, the first liquid crystal retardation film may have an in-plane retardation (Re) of about 100 nm to about 220 nm, and, in an embodiment, about 100 nm to about 180 nm, at a wavelength of 550 nm. For example, the first liquid crystal retardation film may be a λ/4 retardation film. In an embodiment, the second liquid crystal retardation film may have an in-plane retardation (Re) of about 225 nm to about 350 nm, and, in an embodiment, about 225 nm to about 300 nm, at a wavelength of 550 nm. For example, the second liquid crystal retardation film may be a λ/2 retardation film.

In an embodiment, for circular polarization of the linear polarized light, the first liquid crystal retardation film may have an in-plane retardation (Re) of about 225 nm to about 350 nm, and, in an embodiment, about 225 nm to about 300 nm, at a wavelength of 550 nm. For example, the first liquid crystal retardation film may be a λ/2 retardation film. In an embodiment, the second liquid crystal retardation film may have an in-plane retardation (Re) of about 100 nm to about 220 nm, and, in an embodiment, about 100 nm to about 180 nm, at a wavelength of 550 nm. For example, the second liquid crystal retardation film may be a λ/4 retardation film.

The first liquid crystal retardation film 20 may have the same thickness as or a different thickness than the second liquid crystal retardation film 40. In an embodiment, for example, each of the first liquid crystal retardation film 20 and the second liquid crystal retardation film 40 may have a thickness of about 0.1 µm to about 30 µm, and, in an embodiment, about 1 µm to 10 µm, for example, 1 µm, 2 µm, 3 µm, 4 µm, 5 µm, 6 µm, 7 µm, 8 µm, 9 µm, or 10 µm. Within this thickness range, the polarizing plate can have a thin thickness and can achieve a target retardation value.

In an embodiment, each of the first liquid crystal retardation film 20 and the second liquid crystal retardation film 40 may be a liquid crystal retardation layer composed of a single layer. In an embodiment, for each of the first and second liquid crystal retardation films composed of the liquid crystal retardation layer, the liquid crystal retardation layer is composed of a single layer, thereby enabling greater reduction in thickness of the polarizing plate.

The liquid crystal retardation layer may be formed of an alicyclic group-containing (meth)acrylic liquid crystal compound or an aromatic group-containing (meth)acrylic liquid crystal compound. The liquid crystal retardation layer may further include additives, such as a leveling agent, a polymerization initiator, an alignment aid, a heat stabilizer, a lubricant, a plasticizer, an antistatic agent, and the like.

In another embodiment, each of the first liquid crystal retardation film and the second liquid crystal retardation film may include a base film and a liquid crystal retardation layer formed on the base film. In an embodiment, each of the first liquid crystal retardation film and the second liquid crystal retardation film may be formed by coating a composition for forming the liquid crystal retardation layer on the base film, followed by curing.

Polarizer

The polarizer 10 is formed on the first liquid crystal retardation film to polarize internal or external light. For the first liquid crystal retardation film composed of the liquid crystal retardation layer, the composition for forming the liquid crystal retardation layer is coated on the polarizer, followed by curing, whereby the first liquid crystal retardation film can be directly formed on the polarizer.

The polarizer may include a polyvinyl alcohol-based polarizer formed by dyeing a polyvinyl alcohol film with iodine or the like. For example, the polyvinyl alcohol-based polarizer may be manufactured by dyeing the polyvinyl alcohol film with iodine or a dichroic dye, followed by stretching the dyed film in a certain direction. In an embodiment, the polyvinyl alcohol-based polarizer is manufactured through swelling, dyeing, and stretching. A method for each of these processes is well known to those skilled in the art. In an embodiment, the polarizer may have a thickness of about 1 µm to about 50 µm, for example, about 1 µm, 2 µm, 3 µm, 4 µm, 5 µm, 6 µm, 7 µm, 8 µm, 9 µm, 10 µm, 11 µm, 12 µm, 13 µm, 14 µm, 15 µm, 16 µm, 17 µm, 18 µm, 19 µm, 20 µm, 21 µm, 22 µm, 23 µm, 24 µm, 25 µm, 26 µm, 27 µm, 28 µm, 29 µm, 30 µm, 31 µm, 32 µm, 33 µm, 34 µm, 35 µm, 36 µm, 37 µm, 38 µm, 39 µm, 40 µm, 41 µm, 42 µm, 43 µm, 44 µm, 45 µm, 46 µm, 47 µm, 48 µm, 49 µm, or 50 µm. Within this thickness range, the polarizer may be used in a light emitting display.

Second Bonding Layer

The second bonding layer 50 is formed between the polarizer 10 and the first liquid crystal retardation film 20 to bond the polarizer 10 to the first liquid crystal retardation film 20.

Here, although the second bonding layer 50 may be formed of the bonding agent described above, it is desirable that the second bonding layer 50 be formed of a typical bonding agent known to those skilled in the art. For example, the second bonding layer 50 may be formed of a water-based bonding agent, a photo-curable bonding agent, or a combination thereof. In an embodiment, the second bonding layer 50 may have a thickness of about 0.1 µm to about 30 µm, and, in an embodiment, about 1 µm to about 10 µm, for example, 1 µm, 2 µm, 3 µm, 4 µm, 5 µm, 6 µm, 7 µm, 8 µm, 9 µm, or 10 µm. Within this thickness range, the second bonding layer 50 may be used in a light emitting display.

The second bonding layer 50 may have a same glass transition temperature as or a different glass transition temperature than the first bonding layer.

In an embodiment, the second bonding layer may be formed of a composition for bonding layers, which includes about 50 parts by weight to about 90 parts by weight of a bifunctional alicyclic epoxy compound; about 5 parts by weight to about 40 parts by weight of a bifunctional (meth)acrylate compound; about 5 parts by weight to about 40 parts by weight of a monofunctional (meth)acrylate compound; and about 1 part by weight to about 10 parts by weight of a photo-acid generator and about 0.5 parts by weight to about 10 parts by weight of a photo-radical initiator relative to a total of 100 parts by weight of the bifunctional alicyclic epoxy compound, the bifunctional (meth)acrylate compound and the monofunctional (meth)acrylate compound. Each of the bifunctional alicyclic epoxy compound, the bifunctional (meth)acrylate compound, the monofunctional (meth)acrylate compound, the photo-acid generator, and the photo-radical initiator may be obtained from typical compounds known to those skilled in the art.

Although not shown in FIG. 1, in an embodiment, an adhesive film may be further formed on a lower surface of the second liquid crystal retardation film 40, that is, on a surface of the second liquid crystal retardation film 40, on which a bonding layer is not formed, to attach the polarizing plate to a light emitting device (for example, an organic light emitting device panel).

Referring again to FIG. 1, the polarizing plate includes the second bonding layer 50. In an embodiment wherein the first liquid crystal retardation film is a liquid crystal retardation layer, the first liquid crystal retardation film may be directly formed on the polarizer without the second bonding layer.

Next, a polarizing plate according to another embodiment will be described with reference to FIG. 2.

Figure 2:
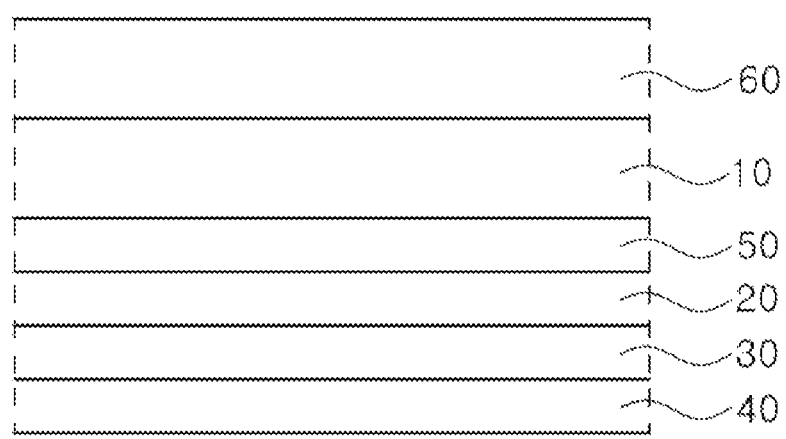
FIG. 2 is a cross-sectional view of a polarizing plate for light emitting displays according to another embodiment of the present invention.

Referring to FIG. 2, a polarizing plate according to an embodiment includes a polarizer 10, a protective layer 60 formed on an upper surface of the polarizer 10, and a second bonding layer 50, a first liquid crystal retardation film 20, a first bonding layer 30, and a second liquid crystal retardation film 40, which are sequentially stacked or formed on a lower surface of the polarizer 10. The polarizing plate according to this embodiment is substantially the same as the polarizing plate of FIG. 1 except that the protective layer 60 is further formed on the upper surface of the polarizer 10.

The protective layer 60 is formed on an upper surface of the polarizer 10 to support the polarizer 10. In addition, the protective layer 60 formed on the upper surface of the polarizer 10 may allow the first liquid crystal retardation film 20 to be directly formed on the polarizer 10 without the second bonding layer upon formation of the first liquid crystal retardation film on a lower surface of the polarizer. The protective layer may include at least one of an optically transparent protective film and an optically transparent protective coating layer.

When the protective layer 60 is a protective film type, the protective layer 60 may include a protective film formed of an optically transparent resin. The protective film may be formed through melting and extrusion of the resin. The resin may be further subjected to stretching, as needed. In an embodiment, the optically transparent resin may include at least one selected from among cellulose ester resins including triacetylcellulose, cyclic polyolefin resins including cyclic olefin polymer (COP), polycarbonate resins, polyester resins including polyethylene terephthalate (PET), polyether sulfone resins, polysulfone resins, polyamide resins, polyimide resins, non-cyclic polyolefin resins, polyacrylate resins including poly(methyl methacrylate), polyvinyl alcohol resins, polyvinyl chloride resins, and polyvinylidene chloride resins. In an embodiment, the protective film is a film formed of a cyclic polyolefin resin including cyclic olefin polymer (COP).

When the protective layer 60 is a protective coating layer type, the protective layer 60 can improve adherence to the polarizer, transparency, mechanical strength, thermal stability, moisture shielding, and durability. In an embodiment, the protective coating layer for the protective layer 60 may be formed of an actinic radiation-curable resin composition including an actinic radiation-curable compound and a polymerization initiator.

The actinic radiation-curable compound may include at least one of a cationic polymerizable curable compound, a radical polymerizable curable compound, a urethane resin, and a silicone resin. The cationic polymerizable curable compound may be an epoxy compound having at least one epoxy group therein, or an oxetane compound having at least one oxetane ring therein. The radical polymerizable curable compound may be a (meth)acrylic compound having at least one (meth)acryloyloxy group therein.

In an embodiment, the protective layer 60 may have a thickness of about 5 μm to about 200 μm, and, in an embodiment, about 30 μm to about 120 μm, for example, 30 μm, 40 μm, 50 μm, 60 μm, 70 μm, 80 μm, 90 μm, 100 μm, 110 μm, or 120 μm. In an embodiment, the protective layer of the protective film type may have a thickness of about 50 μm to about 100 μm, for example, 50 μm, 60 μm, 70 μm, 80 μm, 90 μm, or 100 μm, and the protective layer of the protective coating layer may have a thickness of about 5 μm to about 50 μm, for example, 5 μm, 10 μm, 20 μm, 30 μm, 40 μm, or 50 μm. Within this thickness range, the protective layer can be used in a light emitting display.

Although not shown in FIG. 2, in an embodiment, the polarizing plate may further include a functional coating layer, for example, a hard coating layer, an anti-fingerprint layer, and/or an anti-reflective layer on an upper surface of the protective layer 60.

Although not shown in FIG. 2, in an embodiment, the polarizing plate may further include a third bonding layer between the protective layer and the polarizer when the protective layer 60 is the protective film type. The third bonding layer may be formed of a typical bonding agent for polarizing plates, for example, any of a water-based bonding agent, a photocurable bonding agent, and a pressure sensitive bonding agent. For example, the third bonding layer may be formed of a same bonding agent as the second bonding layer.

A light emitting display according to an embodiment may include a polarizing plate according to an embodiment of the present invention. For example, the light emitting display may include an organic light emitting display, without being limited thereto. Although the light emitting display according to the present invention may be applicable to a non-foldable light emitting display, the light emitting display can exhibit good flexibility when used in a foldable light emitting display.

Next, the present invention will be described in more detail with reference to some examples. However, it should be noted that these examples are provided for illustration only and are not to be construed in any way as limiting the present invention.

Example 1

A polyvinyl alcohol film (saponification degree: 99.5, polymerization degree: 2,000, thickness: 80 μm) was dipped in a 0.3% iodine aqueous solution to be dyed and then stretched to 5 times an initial length thereof. The stretched polyvinyl alcohol film was dipped in a 3% boric acid solution and a 2% potassium iodide aqueous solution to perform color correction, and then was dried at 50° C. for 4 minutes, thereby preparing a polarizer (thickness: 25 μm).

As a first liquid crystal retardation film, a liquid crystal-coated retardation film (Fuji Film Co., Ltd., QL AA 328, cyclic (aromatic) acrylate compound, Re: about 234 nm at a wavelength of 550 nm) was used. Both surfaces of the liquid crystal-coated retardation film were subjected to corona treatment at 250 mJ/cm$^2$.

As a second liquid crystal retardation film, a liquid crystal-coated retardation film (Fuji Film Co., Ltd., QA AB 318, cyclic (aromatic) acrylate compound, Re: about 116 nm at a wavelength of 550 nm) was used. Both surfaces of the liquid crystal-coated retardation film were subjected to corona treatment at 250 mJ/cm$^2$.

As a protective layer, a cyclic olefin resin film (Zeon Co., Ltd., ZF14-013, thickness: 13 μm) was used. One surface of the cyclic olefin resin film was subjected to corona treatment at 250 mJ/cm$^2$.

An epoxy compound, a (meth)acrylate compound, a photo-cationic initiator, and a photo-enhancer were weighed as listed in Table 1 and mixed for 3 hours, thereby preparing a composition for a first bonding layer.

Under conditions of 22° C. to 25° C. and 20% to 60% RH, a protective layer, a composition for bonding layers (third bonding layer), a polarizer, a composition for a bonding layer (second bonding layer), and a first liquid crystal retardation film were sequentially stacked in the stated order, followed by irradiating the protective layer with UV light under conditions of 400 mW/cm$^2$ and 100 mJ/cm$^2$ using a metal halide lamp. Here, the second bonding layer had a thickness of 3 μm and the third bonding layer had a thickness of 3 μm. Each of the second bonding layer and the third bonding layer was formed of a composition comprising 70 parts by weight of a bifunctional alicyclic epoxy compound (cycloaliphatic diepoxide, CELLOXIDE 2021P, Daicel), 20 parts by weight of a bifunctional (meth)acrylate compound (tri(propylene glycol) diacrylate, M-220, Miwon Specialty Chemical Co., Ltd.), 10 parts by weight of a monofunctional (meth)acrylate compound (lauryl acrylate, M-120, Miwon Specialty Chemical Co., Ltd.), 2 parts by weight of a photo-acid generator (diphenyl-4-(phenylthio)phenyl sulfonium hexafluorophosphate, CPI-100P, San-Apro Co., Ltd.), and 1 part by weight of a photo-radical initiator (1-hydroxycyclohexylphenylketone, Irgacure-184, BASF).

Under conditions of 22° C. to 25° C. and 20% RH to 60% RH, the prepared composition for the first bonding layer was coated on the other surface of the first liquid crystal retardation film and a second liquid crystal retardation film was stacked thereon, followed by irradiating the second liquid crystal retardation film with UV light under conditions of 400 mW/cm$^2$ and 100 mJ/cm$^2$ using a metal halide lamp, thereby preparing a polarizing plate. Here, the first bonding layer had a thickness of 3 μm. For measurement of initial peel strength, UV irradiation was performed with a light shielding piece attached to a portion of a lower surface of the second liquid crystal retardation film.

Examples 2 to 6

Each polarizing plate was prepared in the same manner as in Example 1 except that the components and/or the contents of the compositions for the first bonding layer were changed as in Table 1.

Comparative Examples 1 to 4

Each polarizing plate was prepared in the same manner as in Example 1 except that the components and/or the contents of the compositions for the first bonding layer were changed as in Table 1.

The components and/or the contents of the compositions for the first bonding layer used in the Examples and Comparative Examples are shown in Table 1.

Glass Transition Temperature (Unit: ° C.) of First Bonding Layer:

The composition for the first bonding layer was coated to a thickness (e.g., a predetermined thickness) on a process film (PET film) and cured through UV irradiation, thereby preparing a specimen including the first bonding layer having a thickness of 5 μm to 10 μm. For the prepared specimen, tan δ was measured using a dynamic mechanical analyzer (DMA) while raising temperature from 0° C. at a temperature elevation rate of 5° C./min. Among tan δ values according to temperature, a temperature providing the highest tan δ was defined as a glass transition temperature.

TABLE 1

| | Epoxy compound | | | | (Meth)acrylate compound | | | | Glass transition |
|---|---|---|---|---|---|---|---|---|---|
| | A | B | C | D | E | F | G | H | temperature |
| Example 1 | 80 | — | — | — | 20 | — | 6 | 2 | 76 |
| Example 2 | — | 80 | — | — | 20 | — | 6 | 2 | 81 |
| Example 3 | 50 | — | 30 | — | 20 | — | 6 | 2 | 83 |
| Example 4 | 40 | — | 30 | — | 20 | 10 | 6 | 2 | 78 |
| Example 5 | 40 | — | 30 | — | 20 | 10 | 5 | 1 | 77 |
| Example 6 | 30 | 30 | 30 | — | 10 | — | 6 | 2 | 86 |
| Comparative Example 1 | 60 | — | — | — | 40 | — | 6 | 2 | 63 |
| Comparative Example 2 | 10 | — | — | 70 | 20 | — | 6 | 2 | 131 |
| Comparative Example 3 | — | — | 60 | 30 | 10 | — | 6 | 2 | 80 |
| Comparative Example 4 | — | — | 20 | 20 | 60 | — | 6 | 2 | 40 |

A: resorcinol diglycidyl ether (EX-201, NAGASE CHEMTEX)
B: 1,4-cyclohexane dimethanol diglycidyl ether (EX-216, NAGASE CHEMTEX)
C: 1,6-hexanediol diglycidyl ether (EX-212-NAGASE CHEMTEX)
D: (3,4-epoxycyclohexane)methyl 3,4-epoxycyclohexyl carboxylate (CELLOXIDE 2021P, DAICEL)
E: 4-hydroxybutyl acrylate (OSAKA ORGANIC)
F: phenoxy ethyl acrylate (M-140, MIWON SPECIALTY CHEMICAL)
G: (4-methylphenyl)[4-(2-methylpropyl)phenyl]iodonium hexafluorophosphate (IRGACURE 250, BASF)
H: 2,4-diethylthioxanthone (DETX-S, NIPPONKAYAKU)

The polarizing plates prepared in the Examples and Comparative Examples were evaluated as to properties of Table 2 and evaluation results are shown in Table 2.

(1) Initial peel strength (Peel strength 1): After preparation of the polarizing plates in the Examples and Comparative Examples, each polarizing plate was left at 25° C. for 2 minutes. Then, the polarizing plate was cut to a size of 25 mm×150 mm (width×length) including the light shielding piece (about 3 cm), and a double-sided adhesive film was attached to a lower surface of the second liquid crystal retardation film to secure the polarizing plate to a tensile tester (Texture Analyzer). By opening the light shielding piece of the polarizing plate, the first liquid crystal retardation film of the polarizing plate was secured to a jig of the Texture Analyzer. Then, peel strength was measured upon peeling the first liquid crystal retardation film and the second liquid crystal retardation film at 25° C. under conditions of a peeling speed of 300 mm/min and a peel angle of 90°, and was defined as an initial peel strength. An initial peel strength of less than 50 gf/25 mm was rated as x, an initial peel strength of 50 gf/25 mm to less than 100 gf/25 mm was rated as Δ, and an initial peel strength of 100 gf/25 mm to 300 gf/25 mm was rated as ○.

(2) Peel strength (Peel strength 2) as measured after leaving at 25° C. for 72 hours: After preparation of the polarizing plates in the Examples and Comparative Examples, each polarizing plate was left at 25° C. for 72 hours. The peel strength was measured by the same method as in (1) initial peel strength. A peel strength of less than 100 gf/25 mm was rated as x, a peel strength of 100 gf/25 mm to less than 200 gf/25 mm was rated as Δ, and a peel strength of 200 gf/25 mm or more was rated as ○.

(3) Reliability of polarizing plate (unit: %): Each of the polarizing plates prepared in the Examples and Comparative Examples was cut into a specimen having a size of 3 cm×3 cm. With the second liquid crystal retardation film of the specimen disposed to face a light emitting surface of V-7100 (JASCO), the degree of polarization was measured.

For the prepared specimen, initial polarization (P1) was measured.

With the prepared specimen left in a heat chamber (constant temperature of 85° C., high temperature) or a moist heat chamber (constant temperature of 60° C. and constant humidity of 95%, high temperature/high humidity) for 500 hours, degrees of polarization (P2, P3) were measured by the same method as described above. Variation in polarization degree was calculated according to Equations 1 and 2.

(4) Flexibility: An 80 μm thick polyethylene terephthalate (PET) film was attached to one surface of a polarizing plate via an acrylic adhesive, and an 80 μm PET film was attached to the other surface thereof via the acrylic adhesive, followed by cutting the polarizing plate to a size of 6 cm×4 cm (length×width, length: MD of polarizer, width: TD of polarizer), thereby preparing a specimen. In accordance with IEC-62715, the specimen was mounted on a flexibility tester such that the PET film nearest to the polarizer could be placed at an inner side of the polarizing plate upon flexibility testing, followed by repeating 100,000 cycles of bending the specimen at 25° C. under conditions of a bent radius of 5 mm, a bending speed of 30 cycles of bending per minute, and a bent angle of 180° while observing whether cracks or creases were generated in the first liquid crystal retardation film and the second liquid crystal retardation film. Generation of no creases or cracks was rated as ○, and generation of creases and/or cracks was rated as x.

TABLE 2

| | Peel strength 1 | Peel strength 2 | Reliability High temperature | Reliability High temperature/ humidity | Flexibility |
|---|---|---|---|---|---|
| Example 1 | ○ | ○ | 0.003 | 0.031 | ○ |
| Example 2 | ○ | ○ | 0.002 | 0.042 | ○ |
| Example 3 | ○ | ○ | 0.004 | 0.041 | ○ |
| Example 4 | ○ | ○ | 0.004 | 0.066 | ○ |
| Example 5 | ○ | ○ | 0.009 | 0.039 | ○ |
| Example 6 | ○ | ○ | 0.006 | 0.096 | ○ |
| Comparative Example 1 | Δ | Δ | 0.004 | 4.610 | ○ |
| Comparative Example 2 | x | Δ | 0.003 | 0.096 | x |
| Comparative Example 3 | x | Δ | 0.002 | 2.631 | ○ |
| Comparative Example 4 | Δ | Δ | 0.002 | 0.065 | x |

As shown in Table 2, the polarizing plates for light emitting displays according to the present invention exhibited good peel strength of the bonding layer with respect to the liquid crystal retardation film, and good reliability and flexibility, and could minimize or reduce influence on polarized light passing through the first liquid crystal retardation film and the second liquid crystal retardation film under high temperature and/or high temperature/humidity conditions. Although not shown in Table 2, the polarizing plates for light emitting displays according to the present invention had higher Peel strength 2 than Peel strength 1.

On the contrary, the polarizing plates of Comparative Examples 1 and 2, wherein the first bonding layer had a glass transition temperature not within the range of the present invention regardless of the composition comprising at least one of the alicyclic group-containing glycidyl ether and the aromatic group-containing glycidyl ether, exhibited poor peel strength with respect to the liquid crystal retardation film, poor flexibility, or poor reliability. The polarizing plates of Comparative Example 3, wherein the first bonding layer was formed of a composition not comprising at least one of the alicyclic group-containing glycidyl ether and the aromatic group-containing glycidyl ether, the first bonding layer exhibited poor peel strength with respect to the liquid crystal retardation film and poor reliability. The polarizing plates of Comparative Example 4 exhibited poor peel strength with respect to the liquid crystal retardation film and poor flexibility.

While some example embodiments of the present invention have been described herein, it should be understood that various modifications, changes, alterations, and equivalent embodiments may be made by those skilled in the art without departing from the spirit and scope of the present invention.

What is claimed is:

1. A polarizing plate for light emitting displays, comprising: a polarizer; and
   a first liquid crystal retardation film, a first bonding layer, and a second liquid crystal retardation film sequentially stacked on a surface of the polarizer, each of the first liquid crystal retardation film and the second liquid crystal retardation film being formed of a liquid crystal compound,
   wherein the first bonding layer is directly formed on each of the first liquid crystal retardation film and the second liquid crystal retardation film,
   wherein the first bonding layer has a glass transition temperature of about 70° C. to about 100° C. and is formed of a composition comprising:
   an epoxy compound comprising at least one selected from among an alicyclic group-containing glycidyl ether and an aromatic group-containing glycidyl ether, the alicyclic group-containing glycidyl ether consisting of at least one selected from among 1,4-cyclohexane dimethanol diglycidyl ether, bis(4-hydroxycyclohexyl) methane diglycidyl ether, and 2,2-bis(4-hydroxycyclohexyl)-pro pane diglycidyl ether, and the aromatic group-containing glycidyl ether is resorcinol diglycidyl ether, and
   a (meth)acrylate compound comprising a (meth)acrylate containing at least one hydroxyl group,
   wherein the at least one selected from among the alicyclic group-containing glycidyl ether and the aromatic group-containing glycidyl ether is present in about 20 wt % to 75 wt % in the composition for the first bonding layer in terms of solid content, provided that the at least one selected from among the alicyclic group-containing glycidyl ether and the aromatic group-containing glycidyl ether is present in an amount of at least 33 wt % based on a total amount of the epoxy compound,
   wherein the (meth)acrylate containing at least one hydroxyl group is present in an amount of about 5 parts by weight to about 20 parts by weight relative to a total of 100 parts by weight of the epoxy compound and the (meth)acrylate compound, and
   wherein a peel strength of the first bonding layer with respect to each of the first liquid crystal retardation film and the second liquid crystal retardation film before the polarizing plate is left at 25° C. for 72 hours is about 100 gf/25 mm or more, and a peel strength of the first bonding layer with respect to each of the first liquid crystal retardation film and the second liquid crystal retardation film after the polarizing plate is left at 25° C. for 72 hours is about 200 gf/25 mm or more.

2. The polarizing plate for light emitting displays according to claim 1, wherein the polarizing plate has a polarization degree variation $\Delta PE_1$ or $\Delta PE_2$ of about 1% or less according to Equation 1 or 2:

$$\Delta PE_1 = |P1 - P2|, \qquad \text{Equation 1}$$

where P1 indicates an initial degree of polarization (unit: %) as measured on a specimen obtained by cutting the polarizing plate to a size of 3 cm×3 cm (length×width, MD of polarizer×TD of the polarizer), and P2 indicates a degree of polarization (unit: %), as measured on the specimen after leaving the specimen at a constant temperature of 85° C. for 500 hours; and $$\Delta PE_2 = |P1 - P3|, \qquad \text{Equation 2}$$

where P3 indicates a degree of polarization (unit: %), as measured on the specimen after leaving the specimen under constant temperature and humidity conditions of 60° C. and 95% for 500 hours.

3. The polarizing plate for light emitting displays according to claim 1, wherein the composition further comprises an aliphatic acyclic glycidyl ether.

4. The polarizing plate for light emitting displays according to claim 1, wherein the composition is free from any alicyclic epoxy compound.

5. The polarizing plate for light emitting displays according to claim 1, wherein the (meth)acrylate compound further comprises a (meth)acrylate containing an aromatic group.

6. The polarizing plate for light emitting displays according to claim 1, wherein the composition further comprises a photo-cationic initiator and a photo-enhancer.

7. The polarizing plate for light emitting displays according to claim 1, wherein the composition comprises:
about 20 parts by weight to about 95 parts by weight of the at least one selected from among the alicyclic group-containing glycidyl ether and the aromatic group-containing glycidyl ether;
about 5 parts by weight to about 80 parts by weight of the (meth)acrylate compound; and
about 0.5 parts by weight to about 10 parts by weight of a photo-cationic initiator and about 0.1 parts by weight to about 10 parts by weight of a photo-enhancer;
all relative to a total of 100 parts by weight of the (meth)acrylate compound and the at least one selected from among the alicyclic group-containing glycidyl ether and the aromatic group-containing glycidyl ether.

8. The polarizing plate for light emitting displays according to claim 1, wherein the composition comprises:
about 20 parts by weight to about 94 parts by weight of the at least one selected from among the alicyclic group-containing glycidyl ether and the aromatic group-containing glycidyl ether;
about 1 part by weight to about 40 parts by weight of an aliphatic acyclic glycidyl ether;
about 5 parts by weight to about 75 parts by weight of the (meth)acrylate compound; and
about 0.5 parts by weight to about 10 parts by weight of a photo-cationic initiator and about 0.1 parts by weight to about 10 parts by weight of a photo-enhancer;
all relative to a total of 100 parts by weight of the at least one selected from among the alicyclic group-containing glycidyl ether and the aromatic group-containing glycidyl ether, the aliphatic acyclic glycidyl ether, and the (meth)acrylate compound.

9. The polarizing plate for light emitting displays according to claim 1, wherein the liquid crystal compound of each of the first liquid crystal retardation film and the second liquid crystal retardation film is a (meth)acrylic liquid crystal compound containing an alicyclic group or a (meth)acrylic liquid crystal compound containing an aromatic group.

10. The polarizing plate for light emitting displays according to claim 1, further comprising:
a second bonding layer between the polarizer and the first liquid crystal retardation film,
the second bonding layer having a different glass transition temperature than the first bonding layer.

11. The polarizing plate for light emitting displays according to claim 10, wherein the second bonding layer is formed of a water-based bonding agent or a photocurable bonding agent.

12. The polarizing plate for light emitting displays according to claim 1, further comprising:
a protective layer on another surface of the polarizer.

13. The polarizing plate for light emitting displays according to claim 12, wherein the protective layer comprises at least one of a protective film or a protective coating layer.

14. A light emitting display comprising the polarizing plate for light emitting displays according to claim 1.

15. The light emitting display according to claim 14, wherein the light emitting display comprises a foldable light emitting display.

* * * * *